United States Patent [19]
Yoder

[11] 3,968,455
[45] July 6, 1976

[54] INJECTION LASER WITH INTEGRAL MODULATOR

[75] Inventor: Max N. Yoder, Falls Church, Va.

[73] Assignee: The United States of America as represented by the Secretary of the Navy, Washington, D.C.

[22] Filed: Mar. 5, 1974

[21] Appl. No.: 448,303

Related U.S. Application Data

[63] Continuation-in-part of Ser. No. 335,978, Feb. 26, 1973, abandoned.

[52] U.S. Cl. .................. 331/94.5 H; 331/94.5 PE; 357/18
[51] Int. Cl.² ........................................ H01S 3/00
[58] Field of Search ............... 331/94.5 H, 94.5 M, 331/94.5 PE; 350/160 R; 357/18

[56] References Cited
UNITED STATES PATENTS
3,747,018  7/1973  Tait et al. ................ 331/94.5 H Primary Examiner—Edward S. Bauer
Attorney, Agent, or Firm—R. Sciascia; R. Beers; S. Sheinbein

[57] ABSTRACT

The semiconductor target of a GEISHA or EBIC device is integrated with an injection laser diode to form a unitary structure. The electrons created in the GEISHA by impact ionization are swept directly into the injection laser to cause lasing action. This eliminates the need for transmission line connecting the GEISHA to the injection laser diode.

9 Claims, 1 Drawing Figure

U.S. Patent July 6, 1976 3,968,455
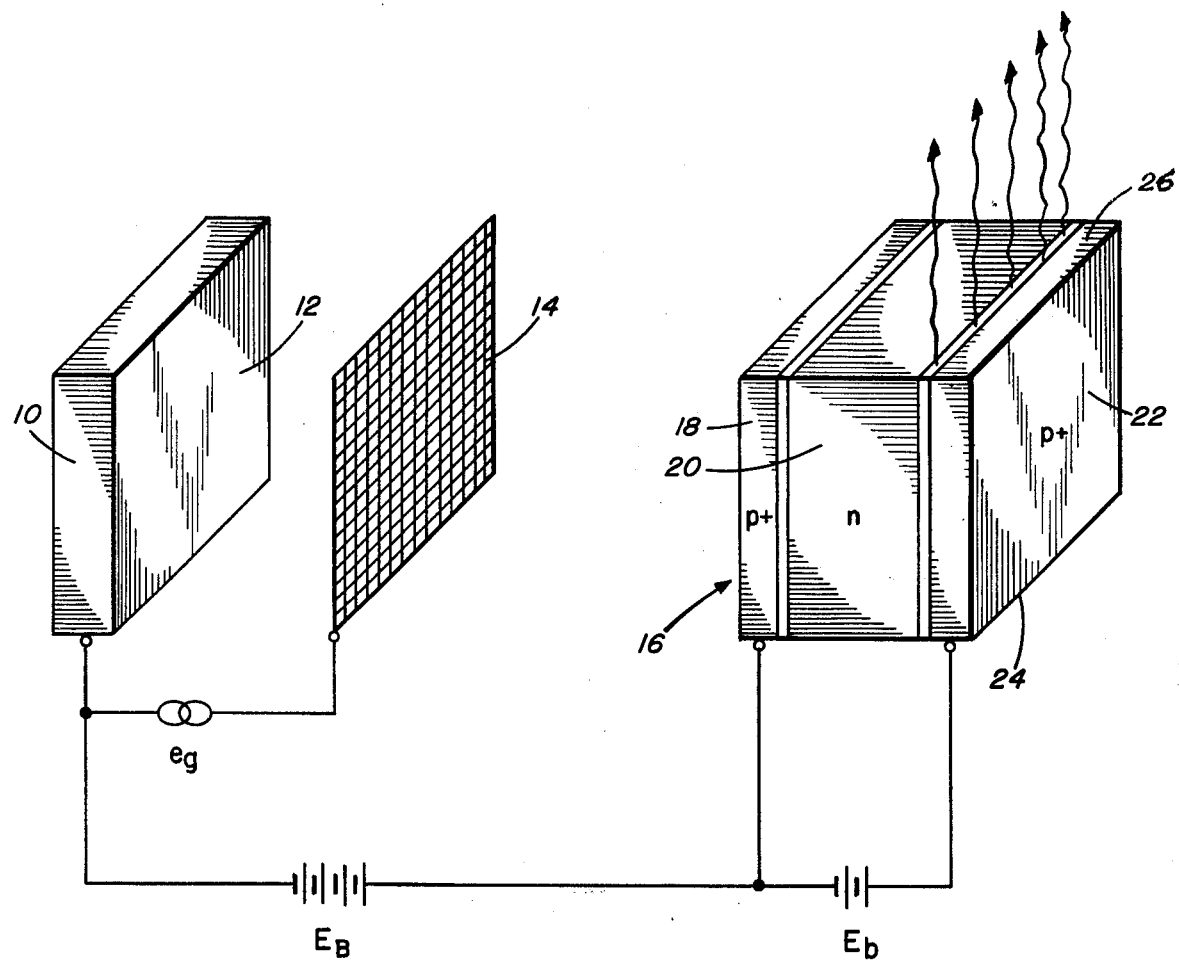

INJECTION LASER WITH INTEGRAL MODULATOR

BACKGROUND OF THE INVENTION

This application is a continuation-in-part of application Ser. No. 335,978 filed Feb. 26, 1973 and now abandoned.

The present invention relates generally to the field of injection lasers and more particularly to the modulation of injection laser beams.

Injection lasers are inherently low impedance, high current devices. Injection laser arrays, in which the individual lasers are electrically connected in parallel, have even lower impedance and required even higher current. In order to get useful laser output pulses the current must be delivered in a very short period of time; i.e., the current must be delivered to the laser in a short, sharp pulse. The requirements of high current combined with the requirement of a sharp pulse puts a heavy burden on the modulation equipment. Not only are the modulators required to switch very large currents in extremely short time periods, but high current-low impedance transmission lines are necessary to connect the modulator to the laser. These lines are large, heavy, expensive and difficult to design.

SUMMARY OF THE INVENTION

A form of amplifier known as Gun, Electron Injection, for Semiconductor Hybrid Amplification (GEISHA) or as Electron Beam Induced Conductivity (EBIC) has recently been developed and shown to provide pulse amplification characterized by fast rise times and large gain-bandwidth products. These devices are known in the art and will not be described in detail. Basically, they consist of a reverse-biased semiconductor diode upon which a high-energy electron beam is caused to impinge. The energy in the impinging electron beam causes the creation of electron-hole pairs in the semiconductor material, whereby current flows in the diode. Since each impinging electron can create thousands of electron-hole pairs (the number created being dependent on the bombarding electron energy) the diode current is an amplification of the bombarding electron beam.

In accordance with the present invention, the semiconductor target of a GEISHA device called herein GEISHA diode or junction is combined with an injection laser in a unitary structure. The GEISHA diode has a thin (½ micron or less) p region which allows the high-energy, or energetic, electrons to penetrate to the n region. GEISHA devices are described in the prior art, for example, see "Device delivers kw output in picoseconds"', Dobriner, Electronic Design 22, Oct. 24, 1968, or "Electro Beam Switched P N Junctions," Brown IEEE Trans. on Elec. Devices, ED-10, 8–12, 1963. The semi-conductor target of the invention has a three-layer structure in which the middle layer functions as part of both the GEISHA device and the injection laser. The GEISHA junction is reverse-biased while the injection laser junction is forward-biased. The electrons created in the semiconductor material by the electron beam are swept by the bias-created electric field through the injection laser junction to cause the emission of the laser beam. The invention thus obviates the low impedance transmission line between the modulator and laser. Because of the amplifying effect of the GEISHA diode, the bombarding electron beam is a low perveance, low currentdensity beam conducive to long cathode life and relatively easy to turn off and on in a short time period.

OBJECTS OF THE INVENTION

An object of the invention to eliminate the need for a transmission line between a modulator and an injection laser.

Another object of the invention is to integrate an injection laser and its modulator.

A further object of the invention is to provide a semiconductor electron beam target which functions both as a GEISHA diode and as an injection laser.

Other objects, advantages, and novel features of the present invention will become apparent from the following detailed description of the invention when considered in conjunction with the accompanying drawings.

BRIEF DESCRIPTION OF THE DRAWINGS

The figure shows a preferred embodiment of the invention.

DESCRIPTION OF THE PREFERRED EMBODIMENT

Referring to the figure, a cathode 10 of the type conventionally used in GEISHA or EBIC device has an electron emitting surface 12. Control grid 14 is disposed adjacent the surface 12 so as to control the flow of electrons in the usual manner. The semi-conductor target 16 is comprised of a p + region 18 facing the cathode 12, an n region 20, and a p + region 22. The term p + is well-known in the art and refers to semiconductor material of the p-type having about $10^{19}$ parts per cubic cm. of impurity material. Control voltage $e_g$ is applied between the cathode 10 and grid 14. An accelerating voltage, DC voltage supply $E_B$, is connected between layer 18 and cathode 10. DC bias voltage supply Eb is connected to the semi-conductor target in the polarity shown in the Figure to reverse-bias the junction formed by layers 18 and 20, and to forward-bias the junction formed by layers 20 and 22. The cathode 10, grid 14 and target 16 are enclosed in an evacuated envelope (not shown) which must be light transmissive at least in one region where the laser beam can pass through it.

The semiconductor junction nearest the cathode, that formed by layers 18 and 20, is reverse-biased by Eb. Layers 18 and 20 comprise the GEISHA diode. The layers 20 and 22 comprise the injection laser diode and it is forward biased. However, there is no forward current in the quiescent state since the reverse-biased junction is in series connection with the forward-biased junction. A signal eg is applied between the cathode and grid and creates an electron beam which is accelerated by voltage $E_B$ and bombards the target 16 on surface 18. The energetic electrons of the electron beam are accelerated to such velocity that they penetrate through p + region 18 into n region 20 where, by impact ionization, they create electron-hole pairs. The number of pairs created per energetic electron is proprotional to the accelerating potential $E_B$. By virtue of the bias supply Eb, an electric field exists across the depleted n region of the semiconductor. This electric field sweeps the impact-ionization-created electrons across the n region and into p + region 22 where they are collected and where a large number are inverted to provide stimulated emission. The impact-ionizationcreated holes are swept into p + region 18 where they are collected. For sufficiently high values of $E_B$ (for example, over ten thousand volts) the semiconductor current is thousands of times greater than the beam current.

The semiconductor target of the invention can be made by growing an additional semiconducting layer to the heteroepitaxial injection laser. In the Figure, layer 18 is grown onto a injection laser 20, 22, which can be, for example, GaAs. The additional layer 18 forms a reversebiased junction with injection laser to constitute a GEISHA target. The layer 18 is very thin (for example, 0.5 $\mu$m) to permit a sufficient number of bombarding electrons to reach the depleted n region. The exterior surface of layer 18 is metalized to a thickness of approximately 3000 A°. This enables it to carry the large currents present while being thin enough to permit bombarding electrons to penetrate it. There is also a metalized surface contact on layer 22 which does not have to be thin since no electrons penetrate it.

Semiconductor material choice is primarily constrained by the wavelength of the radiation sought. Shorter wavelengths. dictate high bandgap material. Higher bandgap material, however, reduces the EBIC current gain of the amplifier portion of the semiconductor. This problem can be solved by creating, by heteroepitaxial or other techniques, a graded bandgap depletion region within the semiconductor. That is, the n material 20 nearest the amplifying junction has a lower bandgap, and therefore a higher impact ionization constant, than the n material adjacent the laser junction.

It should be noted that the device operates even if the n material is not graded with respect to bandgap. However, it will operate more efficiently if the n material near the amplifying junction has a lower bandgap than the n material near the lasting junction.

The two opposite semiconductor faces 24 and 26 are optically flat and parallel and the two complementary faces are roughened to obtain the conventional Fabry-Perot cavity. Cylindrical, triangular and rectangular semiconductor laser cuts may also be utilized but they are less efficient.

The gridded electron gun of the Figure can be replaced by a gun employing traveling wave deflection modulation such that the signal propagation along the deflection structure is at the same velocity as the electron beam velocity. Of course, beam forming and accelerating anodes must be added. Such modulation and a rectangularly shaped electron beam will create an extremely fast device turn-on time. A DC bias on the deflection plates is required to deflect the electron beam off target when no signal is applied.

Gallium Aresenide (GaAs) semiconducting material may be used to obtain a simple embodiment of the invention. GaAs has a bandgap of 1.513 electron volts (ev) at 77°K. A p+ substrate 22 is chosen with an impurity concentration of Zinc in the amount of $1 \times 10^{19}$ parts/cm$^3$. An $n$ layer 20 is grown on the substrate to a thickness of 10 to 30 micrometers ($\mu$m). Impurity concentration in the $n$ layer is preferably held to less than $5 \times 10^{17}$ parts/cm$^3$. Sulfur may be used as the donor impurity. A final p+ layer 18 may be added either by diffusion or ion implantation of Zinc to a level in excess of 10$^{19}$ parts/cm$^3$. Depth of the p+ layer should be held to less than 0.5 $\mu$m. The substrate is then polished (by standard mechanical and chemical techniques) to obtain a p+ layer 22 thickness of not more than 200 $\mu$m or not less than 25 $\mu$m. The n layer may, for example, be between 10 and 30 $\mu$m. A typical GEISHA diode may have dimensions of 0.4 $\times$ 1 $\mu$m for the face which the electron beam strikes.

If it is decided to grade the device and the device is being grown from the injection laser side, phosphorus may be mixed with the GaAs after the laser junction in the proportion of about 30% phosphorus to 70% arsenic. The amount of phosphorus is gradually decreased until it is zero at the GEISHA diode junction. Thus the bandgap of the n material at the laser junction would be about 1.65 electron volts and the bandgap at the GEISHA diode junction about 1.513 ev.

Ohmic contacts are applied and standard die-attach procedures are used to mount the device. Optical gain within the junction area (due to band-to-band or band-to-acceptor recombination) can be very high for reasonable electron - hole distributions. Stimulated emission (lasing action) can thus be observed without the geometric mode selection obtained by junction edge polishing. Threshold current required for stimulated emission can, however, be lowered by constructing an optical resonant cavity.

A Fabry-Perot optical cavity may be made by polishing the junction edge faces (top and bottom in the figure) optically flat and parallel to each other and perpendicular to the plane of the junction. This polishing may be done by standard mechanical and chemical means prior to the die-attach mounting or by ion beam machining after mounting. Since the optical index of refraction of GaAs is about 3.6 at 1.47 ev radiation wavelength, most of the radiation will be internally reflected such that the polished faces need not be mirrored with silver. A radiation peak of 8400 A° (1.47 ev) is exhibited at 77° K. This peak shifts toward 9050 A° as the semiconductor temperature is increased. Threshold current density increases as a function of absolute temperature cubed.

A Fabry-Perot cavity is not required with all semiconductor materials.

Other semiconductor materials will also work in the present invention. Among those easiest to develop are gallium phosphide and gallium arsenide phosphide. Both will provide radiation in the visible region. Indium arsenide phosphide will provide longer wavelength radiation (0.9 – 1.1 $\mu$m) depending on the mole fraction of InP. This material is difficult to process. Other materials exhibiting semiconducting properties, population inversion, and recombination will also prove effective as targets when processed into the depicted three layer structure.

Dimensional relationships in the electron gun structure are not critical for video modualtion frequencies. Separation between control grid 14 and cathode 12 of 0.01 inches provides adequate high frequency modulation response when combined with grid (14) to target (16) spacing of 0.5 inches.

Obviously, many modifications and variations of the present invention are possible in light of the above teachings. It is therefore to be understood that, within the scope of the appended claims, the invention may be practiced otherwise than as specifically described.

What is claimed is:

1. A semiconductor laser comprising:
   a first p-type semiconductor layer,
   a second n-type semiconductor layer adjacent said first layer, a third p-type semiconductor layer adjacent said second layer on the opposite side of said second layer from said first layer, means to apply an electric field across said three layers so that the junction between said first and second layers is reverse-biased and the junction between said second and third layers is forward-biased, and means for directing an electron beam onto said first layer to cause current to flow through said junctions causing laser light to be emitted from the region of said forward-biased junction.

2. The semiconductor laser of claim 1 wherein said second layer has a graded bandgap.

3. The semiconductor laser of claim 1 wherein said three layers are GaAs.

4. The semiconductor laser of claim 1 wherein opposite faces of the forward-biased junction are optically polished to form a Fabry-Perot cavity.

5. The semiconductor laser of claim 1 wherein the electron beam is modulated at video frequencies to produce a video frequency modulated laser beam output.

6. Apparatus for producing a laser beam comprising:
means for emitting a beam of electrons into an evacuated space;
means for controlling the flow of said electron beam;
means for accelerating the speed of the electrons in said beam; and
target means for receiving the beam of electrons and for producing coherent monochromatic light in response thereto,
said target means being a unitary three-layered member which includes semiconductor diode means for generating an amplified flow of electrons in response to said electron beam and lasing semiconductor diode means for generating said light in response to said amplified flow of electrons,
said target means having first, second and third layers forming first and second junctions respectively, said first and third layers being of p+ type semiconductor material and said second layer being of n type semiconductor material,
said first layer facing the electron beam emitting means,
said first and second layers comprising a GEISHA diode which constitutes the electron flow generating means,
said second and third layers comprising the injection laser diode, and
said laser-light generating means comprising an injection laser diode.

7. The apparatus of claim 6 wherein said said first layer is substantially transparent to energetic electrons.

8. The apparatus of claim 7 wherein the n type material has a lower bandgap adjacent the first junction than it has adjacent the second junction.

9. The apparatus of claim 7 wherein said electron-beam flow-controlling means comprises a grid disposed between the electron emitting means and the target.

* * * * *